(12) United States Patent
Jeong et al.

(10) Patent No.: US 7,024,598 B2
(45) Date of Patent: Apr. 4, 2006

(54) NONVOLATILE SEMICONDUCTOR MEMORY DEVICE WITH A FAIL BIT DETECTING SCHEME AND METHOD FOR COUNTING THE NUMBER OF FAIL BITS

(75) Inventors: Jae-Yong Jeong, Kyunggi-do (KR); Sung-Soo Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 556 days.

(21) Appl. No.: 10/003,390

(22) Filed: Oct. 30, 2001

(65) Prior Publication Data

US 2002/0069381 A1 Jun. 6, 2002

(30) Foreign Application Priority Data

Dec. 4, 2000 (KR) ................. 2000-73031

(51) Int. Cl.
*G06F 11/00* (2006.01)
*G11C 29/00* (2006.01)
(52) U.S. Cl. .............. 714/704; 714/718; 714/736
(58) Field of Classification Search ........... 714/718, 714/719, 723, 736, 798, 819, 820, 821, 824, 714/704, 707, 54, 42; 365/200, 201, 189
See application file for complete search history.

(56) References Cited

U.S. PATENT DOCUMENTS

| | | | |
|---|---|---|---|
| 5,337,318 A * | 8/1994 | Tsukakoshi et al. | ........ 714/708 |
| 5,473,563 A | 12/1995 | Suh et al. | |
| 5,541,879 A | 7/1996 | Suh et al. | |
| 5,546,341 A | 8/1996 | Suh et al. | |
| 5,712,818 A | 1/1998 | Lee et al. | |
| 6,019,502 A * | 2/2000 | Baeg et al. | ................. 714/718 |
| 6,032,264 A * | 2/2000 | Beffa et al. | .................... 714/7 |
| 6,073,258 A * | 6/2000 | Wheater | .................... 714/718 |
| 6,141,779 A * | 10/2000 | Hill et al. | .................... 714/710 |
| 6,243,840 B1 * | 6/2001 | Raad et al. | ................ 714/719 |

* cited by examiner

Primary Examiner—Christine T. Tu
(74) Attorney, Agent, or Firm—Marger Johnson & McCollom, P.C.

(57) ABSTRACT

A nonvolatile semiconductor memory device has a special test mode and circuitry for counting its own fail bits. During the test mode, test data is stored in the memory, and also in a special expected data buffer. The test data stored in the memory cells are then compared to that stored in the expected data buffer. Where there is no correspondence, fail bits are detected. The lack of correspondence is registered, counted, and output to a data output buffer block.

32 Claims, 16 Drawing Sheets

Fig. 6

| Number of Fail Bits | | More than 2 Bits | | 1 Bit | none |
|---|---|---|---|---|---|
| Input | FailFlag0 | ⎍⎍....⎍⎍ | ⎍⎍ | ⎍⎍ | |
| | FailFlag1 | | ⎍⎍ | | |
| Output | FailStatus0 | ⌐ | ⌐ | ⌐ | |
| | FailStatus1 | ⌐ | ⌐ | | |

NONVOLATILE SEMICONDUCTOR MEMORY DEVICE WITH A FAIL BIT DETECTING SCHEME AND METHOD FOR COUNTING THE NUMBER OF FAIL BITS

This application relies for priority upon Korean Patent Application No. 2000-73031, filed on Dec. 4, 2000, the contents of which are herein incorporated by reference in their entirety.

FIELD OF THE INVENTION

The present invention relates to an integrated circuit devices, and more particularly to an electrically erasable and programmable nonvolatile semiconductor memory device for use in electronic devices.

BACKGROUND OF THE INVENTION

An electrically erasable and programmable nonvolatile semiconductor memory device is used for storing data in electronic systems. Such systems are typically equipped with an error correction code algorithm, as is well known in the art. If an error is generated in the system, it can be corrected via the error code algorithm, even though the error may be generated in a reading or writing operation of the nonvolatile semiconductor memory device. That is to say, the electronic system, which is equipped with the error correction code algorithm, allows containing the number of amendable fail bits.

The nonvolatile semiconductor memory device, in particular, NAND type flash memory device comprises an array consisting of plurality of array or memory blocks. In general, every manufactured memory array includes allowable bad blocks, which are not substantially used.

A test operation is performed on the packaged or completed NAND type flash memory device before this memory device is loaded. When the test operation is performed, such memory device should be discarded if it is determined that at least one of normal array blocks of the array have fail bit(s).

More particularly, if the number of fail bits of the array block found in the test operation does not exceed the number of amendable fail bits of the electronic system, the NAND type flash memory device having a bad block determined in the test operation can be used in the electronic system which is equipped with the error correction code algorithm. By keeping more of the manufactured memory devices, the yield can be improved.

There are a number of ways of testing the manufactured memory devices. Many packaged memory devices can be tested concurrently, to reduce testing time. Then, as the error capturing RAM of the test device simultaneously testing the packaged memory devices is limited, a total test result is stored in the error capture RAM of the test device. According to this test scheme, such an array block is determined as a bad block, if at least one bit is failed in each array block of the respective packaged memory device. The problem with this technique is that it is impossible to verify the number of fail bits in the array block determined as the bad block.

In another way of testing, the fail bits are counted one by one in each test process by using software. That is, the exact number of fail bits of each memory device can be counted by storing the test result corresponding to every memory cells to the error capture RAM of the test device. The problem, however, with such a software scheme is that, as the error capture RAM of the test device is limited, the number of memory devices that can be tested simultaneously is reduced. This means that overall test time must be increased.

A need remains for determining exactly the number of fail bits of the memory device accepted in the electronic system, so that the memory device determined as a bad chip in a test operation may be available.

SUMMARY OF THE INVENTION

It is, therefore, an object of the present invention to provide a nonvolatile semiconductor memory device that can count the number of fail bits generated in one of its array blocks.

It is another object of the invention to provide a method for counting the number of fail bits generated in an array block of the nonvolatile semiconductor memory device.

It is still another object of the invention to provide a nonvolatile semiconductor memory device that can be tested in reduced time, and a testing method thereof.

It is further still another object of the invention to provide a nonvolatile semiconductor memory device with improved yield, and a testing method thereof.

In order to attain the above objects, the present invention provides semiconductor memory devices and methods for determining exactly the number of their own fail bits.

A nonvolatile semiconductor memory device according to an embodiment of the invention has a special circuitry for counting its own fail bits in a special test mode. During the test mode, test data is stored in the memory, and also in a special expected data buffer. The test data stored in the memory cells are then compared to that stored in the expected data buffer. Where they do not correspond, that is registered as detected fail bits.

The nonvolatile semiconductor memory device can count exactly the number of fail bits generated in the process of programming/reading the data in/from the memory device by the method thereof.

The invention gives the advantage of improving the yield by exactly counting the number of fail bits generated in the process of programming/reading the data in/from the memory device.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The above and other objects, features and advantages of the present invention will become more apparent from the following detailed description when taken in conjunction with the accompanying drawings in which:

FIG. 6 is a view illustrating a wave relation of the input signals and the output signals of FIG. 4;

DESCRIPTION OF THE PREFERRED EMBODIMENT

The following detailed description is of the best modes for practicing the invention. It should be understood that the description of these preferred embodiments is merely illustrative, and that other embodiments are possible. Accordingly, the presented embodiments should not be taken in a limiting sense for the invention.

Figure 1:
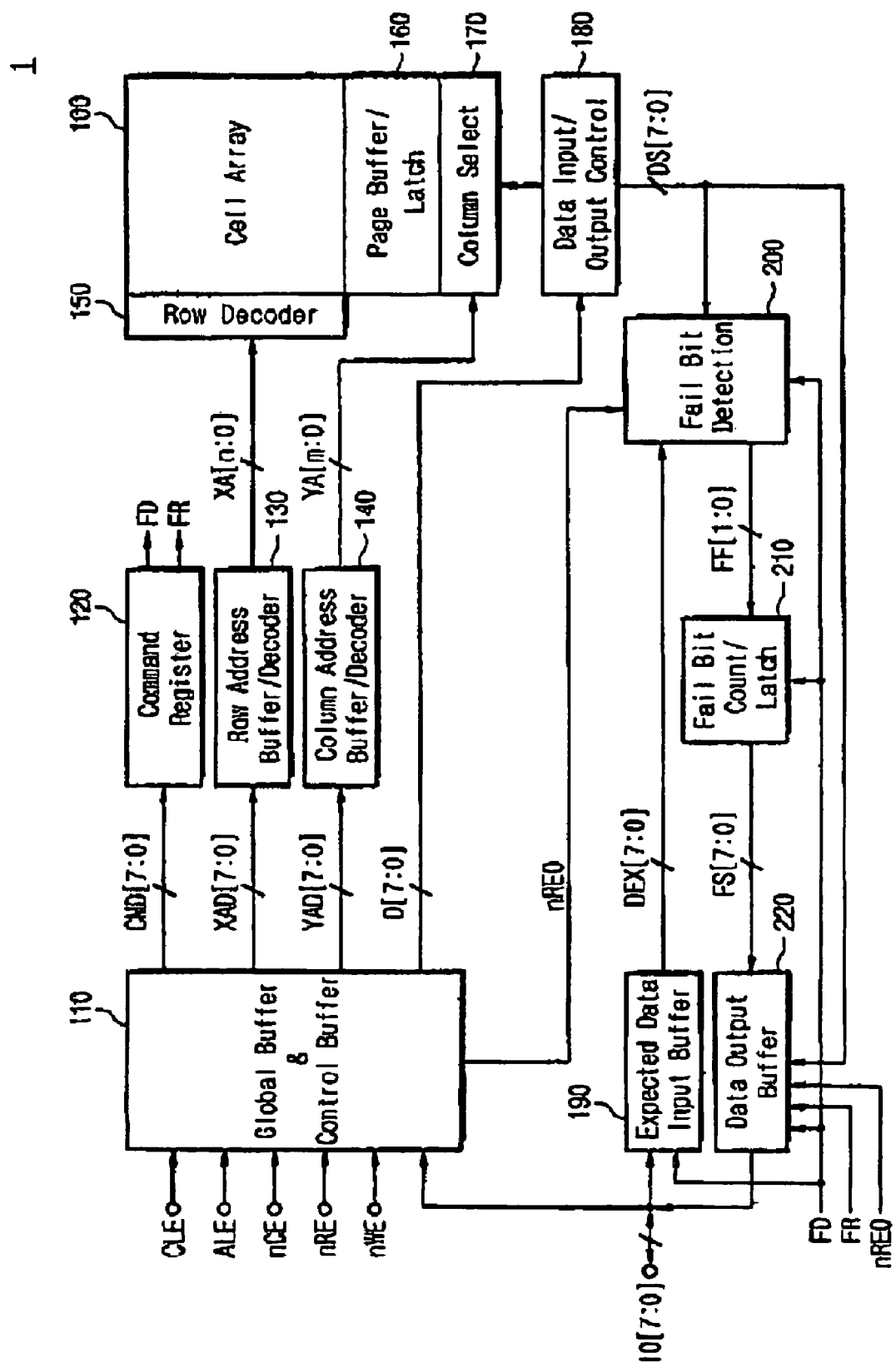
FIG. 1 is a block diagram illustrating a nonvolatile semiconductor memory device according to first embodiment of the present invention.

FIG. 1 is a block diagram showing a nonvolatile semiconductor memory device according to first embodiment of the present invention.

Referring first to FIG. 1, a NAND type flash memory device 1 of a nonvolatile semiconductor memory device comprises an array 100 as a device for storing data. The array 100 comprising a plurality of memory cells arranged in the form of a matrix having rows or wordlines, and columns or bitlines, not shown in the figure. Each memory cell includes an electrically erasable and programmable ROM cell transistor.

The nonvolatile semiconductor memory device 1 comprises a global buffer and control buffer block 110, a command register block 120, a row address buffer and decoder block 130, a column address buffer and decoder block 140, a row decoder block 150, a page buffer and latch block 160, a column select block 170, and a data input/output control block 180.

The global buffer and control buffer block 110 includes a plurality of control buffers for buffering control signals CLE, ALE, nCE, nRE, nWE supplied from the outside and global buffers for receiving addresses or data supplied via input pins IOi (i=0~7). In the embodiment of FIG. 1, the signals applied to the input/output pins IOi are used as addresses, data, or commands according to a combination of the control signals.

When the combination of the control signals inputted currently represents, for example, a command input, the signals CMD[i] inputted to input/output pins IOi are passed to the command register block 120. When the combination of the control signals inputted currently represents, for example, an address input, then the signals XAD[i] and YAD[i] outputted from the global buffer and control buffer block 110 are passed to the row address buffer and decoder block 130 and the column address buffer and decoder block 140, respectively. When the combination of the control signals inputted currently represents, for example, a data input, the signal D[i] outputted from the global buffer and control buffer block 110 according to the signals inputted to input/output pins IOi are passed to the data input/output control block 180.

Continuing to refer to FIG. 1, the command register block 120 generates a fail bit detecting command signal FD or a fail bit read-out command signal FR in response to the signals CMD[i] supplied from the global buffer and command buffer block 110. The row decoder block 150 selects a word line in the memory block selected in the array 100 in response to the address XAD[n:0] supplied from the row address buffer and decoder block 130. During a reading operation, the page buffer and latch block 160 detects and amplifies the data stored in the memory cells related to a selected word line or selected page of the selected memory block and stores the detected data temporally.

During a programming or writing operation, the page buffer and latch block 160 latches the supplied write data temporarily by means of the global buffer and control buffer block 110, the data input/output control block 180, and the column select block 170.

During a reading operation, the column select block 170 selects some of the read-out data bits, for example, the data bits corresponding to input/output pins, which correspond to a page and which is latched in the page buffer and latch block 160, in response to the address signals Yad[m:0] supplied from the column address buffer and decoder block 140, and passes the selected read-out data bits to the data input/output control block 180.

The nonvolatile semiconductor memory device 1 of the present invention further comprises an expected data input buffer block 190, a fail bit detecting block 200, a fail bit counter and latch block 210, and a data output buffer block 220, as is shown in FIG. 1. The expected data input buffer block 190 operates in response to a fail bit detecting command signal FD from the command register block 120 and outputs the expected data bits DEX[i] according to input/output pins IOi.

The point of testing is by having the expected data bits DEX[i] be identical with the data bits programmed in the array 100. This way, if there is a fail bit, it may output something different than programmed.

Testing is accomplished during a test operating mode. During the test operating mode, fail bit detecting command signal FD is activated.

Figure 2:
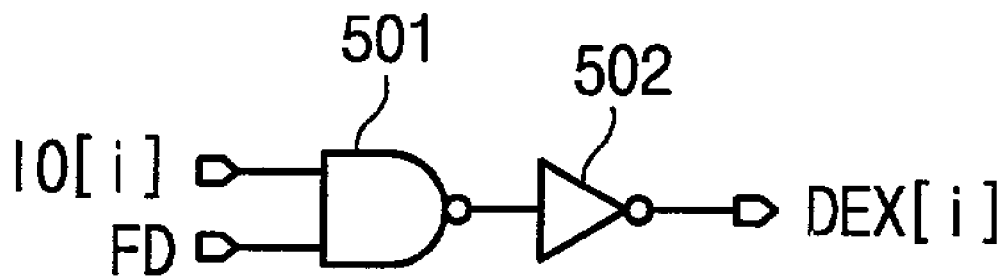
FIG. 2 shows a preferred embodiment of an expected data input buffer block shown in FIG. 1.

A preferred embodiment of the expected data input buffer block 190 according to the present invention is shown in FIG. 2. While the expected data input buffer corresponding to only one input/output pin is shown in FIG. 2, it is apparent that the buffers corresponding to the rest of the input/output pins also have the same structure. The expected data input buffer 190 is comprised of a 2-input NAND gate 501 and an inverter 502. The NAND gate 501 includes first input terminal connected to the corresponding input/output pin IO[i] and second input terminal for receiving the fail bit detecting command signal FD and then the inverter 502 receives the output of the NAND gate 501 and outputs the expected data bit DEX[i].

Continuing to refer to FIG. 1, the fail bit detecting block 200 operates in response to the fail bit detecting command signal FD and receives the read-out data bits DS[i] selected by the column select block 170 in accordance with the read-out enable signal nREO and the fail bit detecting command signal FD. The read-out enable signal nREO can be generated by combination of the signals nRE and nCE by means of logic gates.

Figure 8:
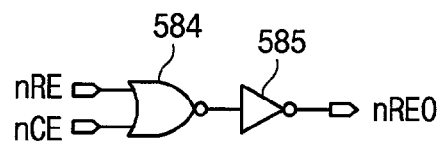
FIG. 8 shows a preferred embodiment of a read-out enable buffer in a global buffer and control buffer block shown in FIG. 1.

Referring briefly to FIG. 8, according to one embodiment, the read-out enable signal nREO is formed by combining signals nRE and nCE through a NOR gate 584 and an inverter 585.

Referring back to FIG. 1, the fail bit detecting block 200 determines whether inputted read-out data bits DS[i] each match the expected data bits DEX[i] inputted from the expected data input buffer block 190 or have fail bit(s). The fail bit detecting block 200 generates fail flag signal FF[0] or FF[1] according to the determination result. A preferred embodiment of the fail bit detecting block 200 according to the present invention is shown in FIG. 3.

Figure 3:
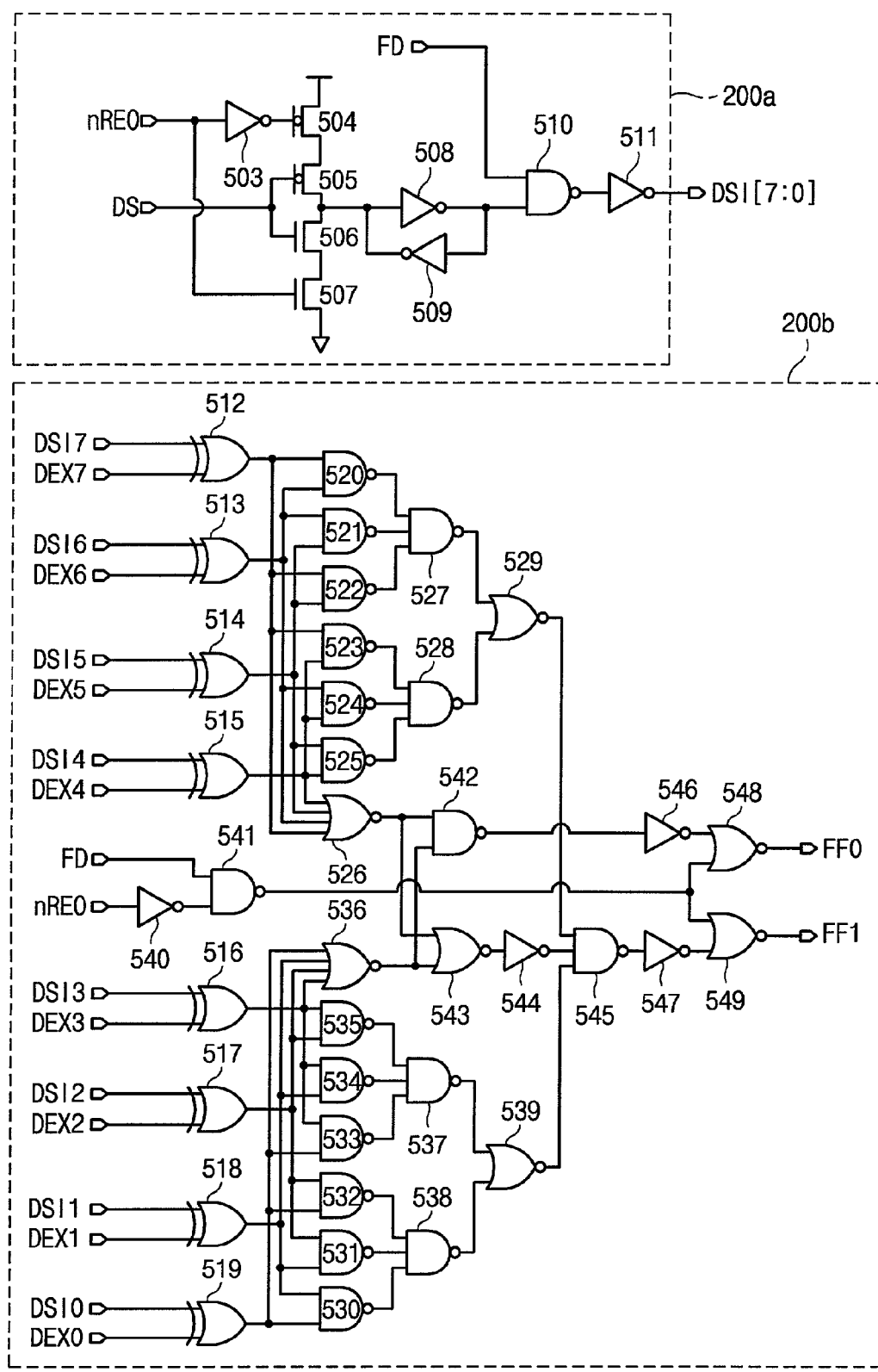
FIG. 3 shows a preferred embodiment of a fail bit detecting block shown in FIG. 1.

Referring next to FIG. 3, the fail bit detecting block 200 includes a number of input parts 200a, each corresponding to inputted read-out data bits DS[7]~DS[0], and a fail flag signal generating part 200b. Only one of the input parts is shown in FIG. 3, as the rest of them are preferably implemented with the same structure.

Input part 200a outputs the corresponding read-out data bits DS[i] in response to the signal FD and nREO as an internal read-out data bit DSI[i]. Input part 200a includes inverters 503, 508, 509, and 511, two PMOS transistors 504 and 505, two NMOS transistors 506 and 507, and a NAND gate 510, which are connected between them as is shown in the figure.

During a normal operation of memory 1, the fail bit detecting command signal FD is maintained at a low level. Then the internal read-out data bit DSI[i] is also maintained at a low level, without regard to a value of the corresponding read-out data bit DS[i], or a logic level of the read enable signal nREO.

During a test mode, the fail bit detecting command signal FD is activated to go to a high level. Then the value of the corresponding internal read-out data bit DSI[i] depends upon the value of the read-out data bit DS[i] inputted during the read enable signal nREO is in a low level.

Continuing to refer to FIG. 3, the fail flag signal generating part 200b compares the internal read-out data bits DSI[i] outputted from the input parts 200a with the corresponding expected data bits DEX[i] outputted from the expected data input buffer 190. The fail flag signal generating part 200b outputs the fail flag signals FF[0] and FF[1] according to the comparison result during the read enable signal nREO is in a low level.

If one of the internal read-out data bits DSI[i], for example, DSI[7] is, for example, a fail bit, that is to say, if the internal read-out data bit DSI[7] does not match the expected data bit DEX[7], the output of a XOR gate 512 becomes "1" and the outputs of the rest of XOR gates 513~515 and 516~519 become "0". According to such condition, when the read-out enable signal nREO goes to a low level, a NOR gate 548 outputs a fail flag signal FF[0] having a low to high transition and the output of the NOR gate 549, FF[1] is maintained in the initial low level. Consequently, if one of the internal read-out data bits is a fail bit, the fail flag signal FF[0] is activated in the form of at least one pulse.

If the internal read-out data bits DSI[7] and DSI[0] are fail bits, the outputs of the XOR gates 512 and 519 become "1" and the outputs of the rest of XOR gates become "0". According to such condition, during the read-out enable signal nREO is in a low level, NOR gates 548 and 549 output fail flag signals FF[0] and FF[1] having a low to high transition, respectively. Consequently, if at least two of the internal read-out data bits are fail bits, the fail flag signals FF[0] and FF[1] are activated in the form of at least one pulse.

Referring back to FIG. 1, the fail bit counter and latch block 210 is initialized when the fail bit detecting command signal FD is transitioned from a low level to a high level. The fail bit counter and latch block 210 counts the number of fail bits in response to the fail flag signals FF[0] and FF[1] outputted from the fail bit detecting block 200 and outputs fail status signals FS[i] as fail codes representing the counted number of fail bits. A preferred embodiment of the fail bit counter and latch block 210 is shown in FIG. 4.

Figure 4:
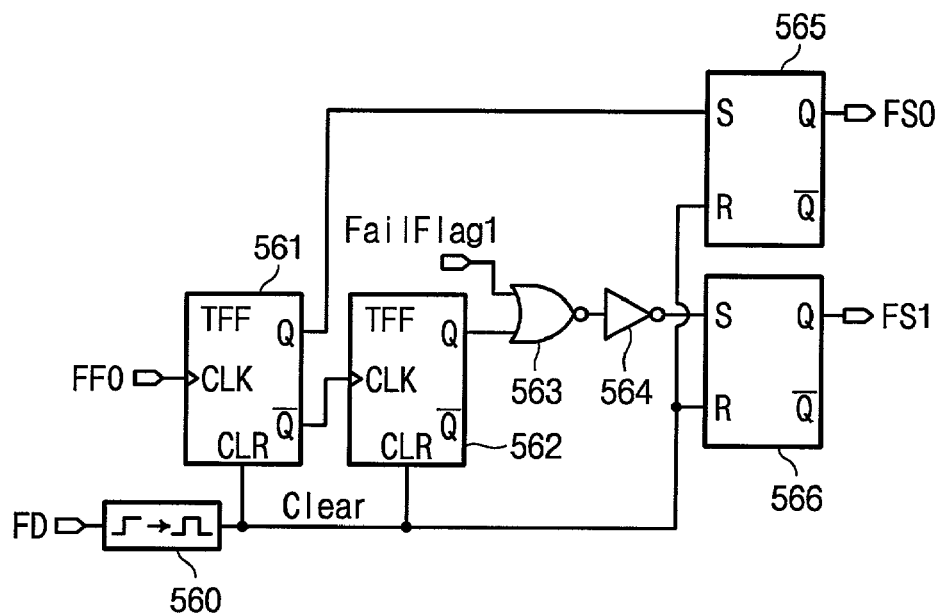
FIG. 4 shows a preferred embodiment of a fail bit counter and latch block shown in FIG. 1.
Figure 5:
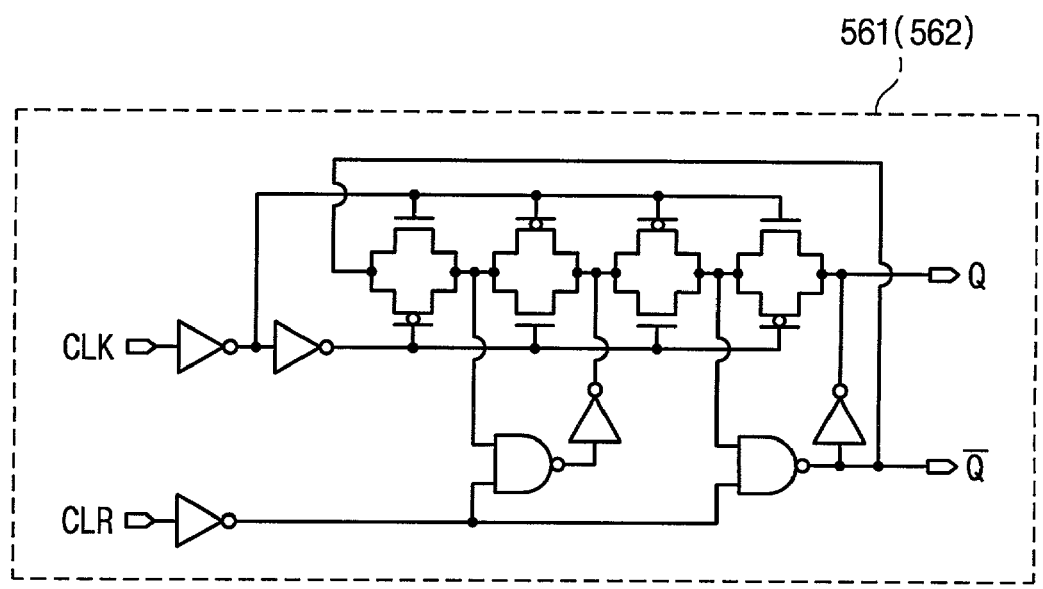
FIG. 5 shows a preferred embodiment of a T flip-flop shown in FIG. 4.

As is shown in FIG. 4, the fail bit counter and latch block 210 includes a pulse generator 560, two T flip-flops 561 and 562, a NOR gate 563, an inverter 564, and S-R flip-flops 565 and 566, which are connected between them as is shown in the figure. The T flip-flops 561 and 562 operate as counters, whereas the S-R flip-flops 565 and 566 operate as latches. A preferred embodiment of the T flip-flop is shown in FIG. 5. The pulse generator 560 generates a pulse signal CLR in response to the fail bit detecting command signal FD having a low to high transition. The T flip-flops 561 and 562 and the S-R flip-flops 565 and 566 are initialized by the pulse signal CLR. The fail bit counter and latch block 210 operates depending upon the number of fail bits as below.

If the number of fail bits is two or more, the fail bit counter and latch block 210 operates as follows. After becoming initialized, when the fail flag signal FF[0] has a low to high transition, the output Q of the T flip-flop 561 has a low to high transition thereby causing the output FS[0] of a S-R flip-flop 565 to have a low to high transition as is shown in FIG. 6. And then if the fail flag signal FF[0] has a low to high transition again, the output Q of the T flip-flop 562 has a low to high transition thereby causing the output of a NOR gate 563 to have a high level regardless of a logic level of the fail flag signal FF[1]. Consequently, the output FF[1] of the S-R flip-flop 566 has a low to high transition as is shown in FIG. 6.

Furthermore, when fail flag signals FF0 and FF1 have a low to high transitions at the same time, as is shown in FIG. 6, the S-R flip-flop 565 outputs a fail status signal FS0 in a high level according to an output of the T flip-flop 561, while the S-R flip-flop 566 outputs a fail status signal FS1 in a high level according to a fail flag signal FF1 in a high level supplied via a NOR gate 563 and an inverter 564.

If the number of fail bits is only one, the operation of the fail bit counter and latch block 210 is as follows. After initialized, when a fail flag signal FF[0] has a low to high transition, the output Q of the T flip-flop 561 has a low to high transition thereby causing the output FS[0] of a S-R flip-flop 565 to have a low to high transition, as is shown in FIG. 6. If there is no fail bit, fail bit signals FS[0] and FS[1] outputted from the fail bit counter and latch block 210 are maintained at a low level as is shown in FIG. 6.

Still referring to FIG. 1, a key feature of the first embodiment of the invention is that detecting, and also counting, the fail bits occurs before the data output buffer block 220. A normal output data path is provided from memory cell array 100 to data output buffer block 220. During a normal read-out operation mode, the data output buffer block 220 delivers read-out data bits DS[i] outputted from the data input/output control block 180 to the corresponding input/output pins IO[i], through the normal data output path.

Detecting, and also counting the fail bits takes place by diverting from the normal output data path. During a test operation mode for detecting and counting the fail bits, the normal data output path of the data output buffer block 220 is blocked. Fail status signals FS[i] (i=0~7) outputted from the fail bit counter and latch block 210 are outputted by the activation of the fail bit read-out command signal FR.

Figure 7:
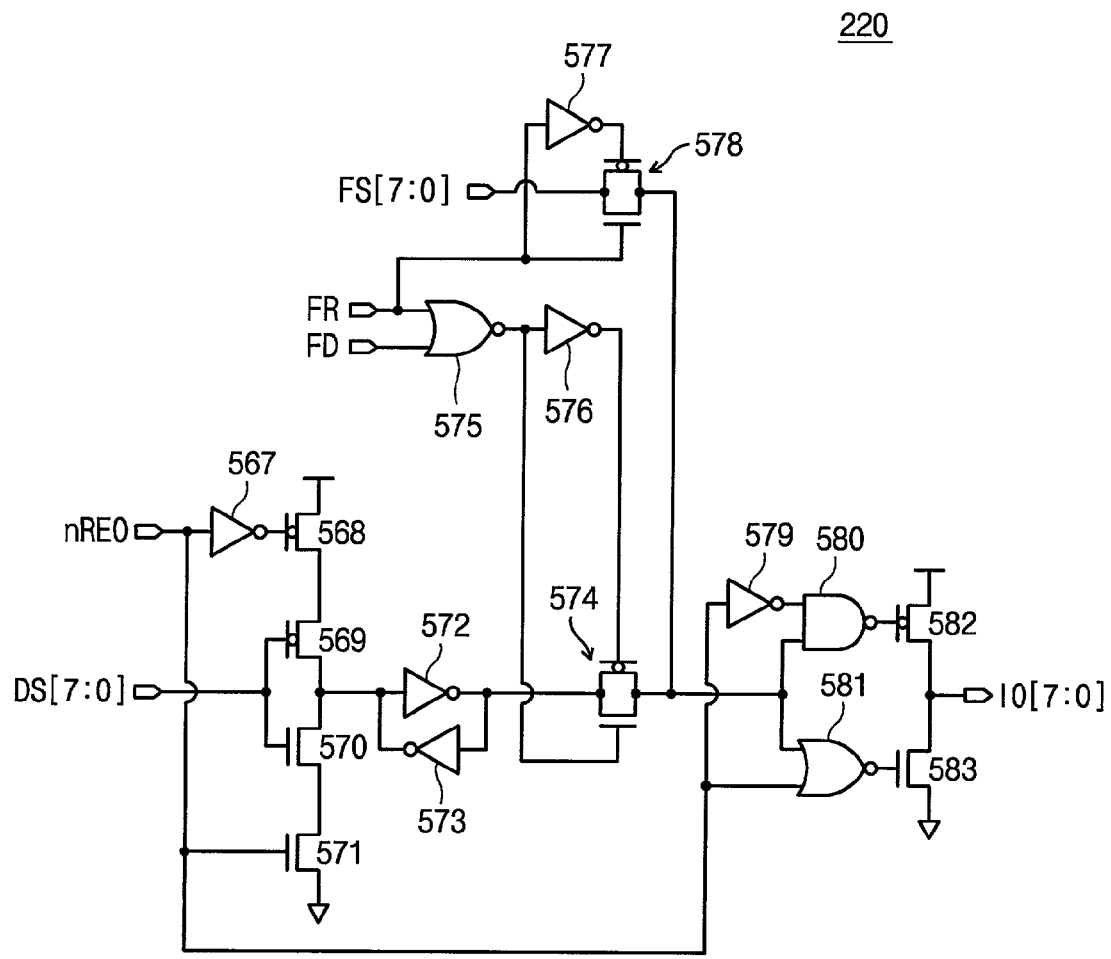
FIG. 7 shows a preferred embodiment of a data output buffer block shown in FIG. 1.

Referring to FIG. 7 illustrating a preferred embodiment of the data output buffer block 220, when the signals FR and FD are maintained at a low level, the normal data output path is formed via a transfer gate 574. On the other hand, when the fail bit read-out command signal FR is maintained at a high level, the normal data output path is blocked by the path gate 574, while the fail status signal FS[i] is outputted to the corresponding input/output pin IO[i] via the transfer gate 578.

The fail status signals FS[i] outputted from the fail bit counter and latch block 210 correspond to the input/output pins IO[i], respectively. In this embodiment, because there is used with only two fail status signals FS[0] and FS[1], the rest of the fail status signals FS[2]~FS[7] will be set to be maintained at a low level.

Figure 17:
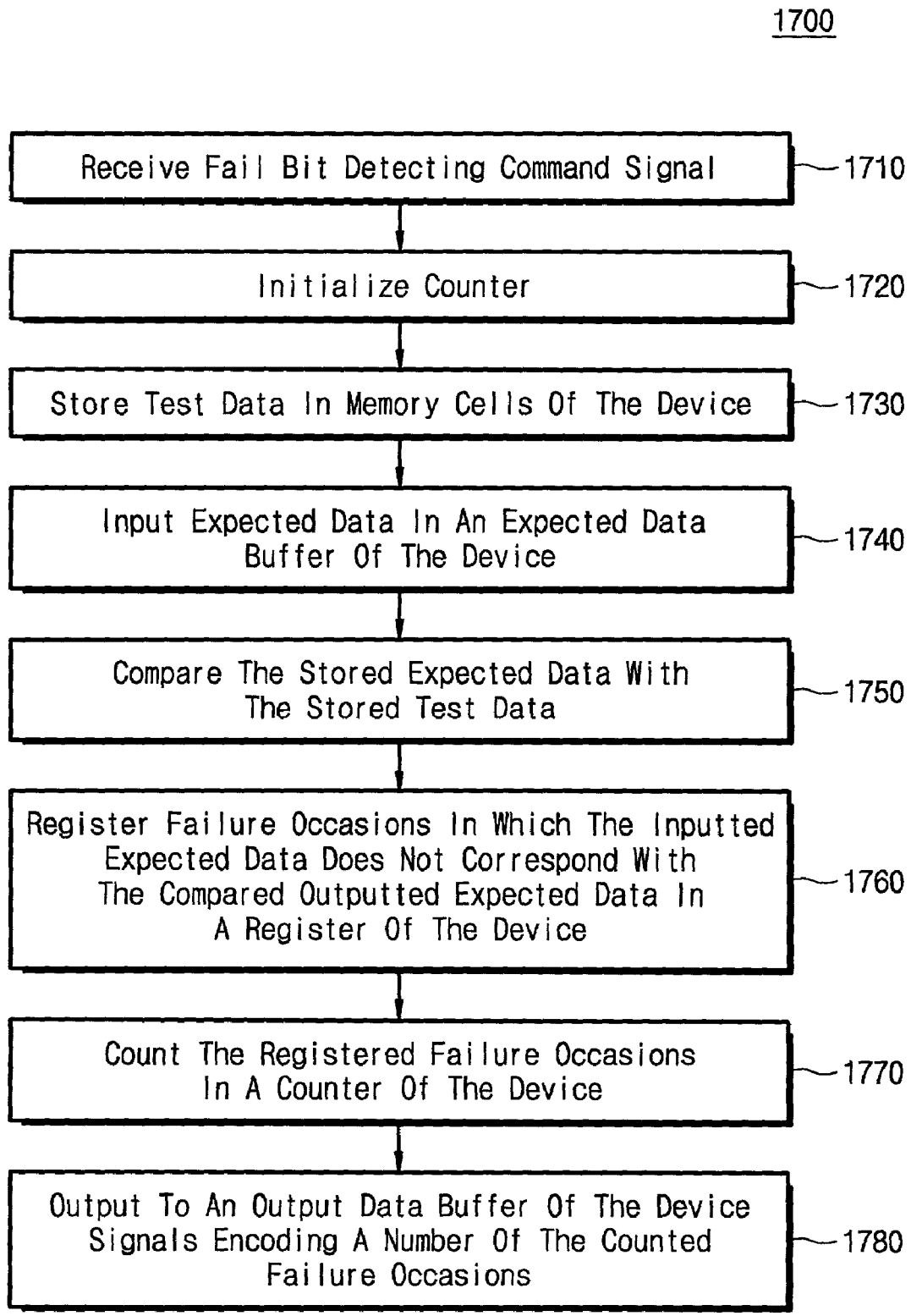
FIG. 17 is a flowchart illustrating a method according to a general embodiment of the present invention.

Referring now to FIG. 17, a flowchart 1700 is used to illustrate a general method according to an embodiment of the invention. The method of flowchart 1700 may also be practiced by a device made according to the invention.

According to an optional box 1710, a fail bit detecting command signal is received. This results in placing a device in a test mode.

According to an optional next box 1720, a counter is initialized. This may be performed as a result of receiving the fail bit detecting command signal.

According to a next box 1730, test data is stored in memory cells of the device. If the bits are not fail bits, then the test data will be stored properly.

According to a next box 1740, expected data is input in an expected data buffer of the device. Preferably, the expected data is identical to the test data.

According to a next box 1750, the stored expected data is compared with the stored test data. This will reveal whether the test data was stored properly. If not, it will be inferred that this was a fail bit.

According to a next box 1760, failure occasions are registered in a register of the device. Failure occasions are instances in which the inputted expected data does not correspond with the compared outputted expected data. These are deemed to have occurred due to the presence of fail bits.

According to an optional next box 1770, the registered failure occasions are counted in a counter of the device.

According to an optional next box 1780, signals are output to an output data buffer of the device. The signals encode a number of the counted failure occasions. This way the number of failed bits is inferred.

A number of variations are possible from the above described method. An example is seen below.

Figure 9:
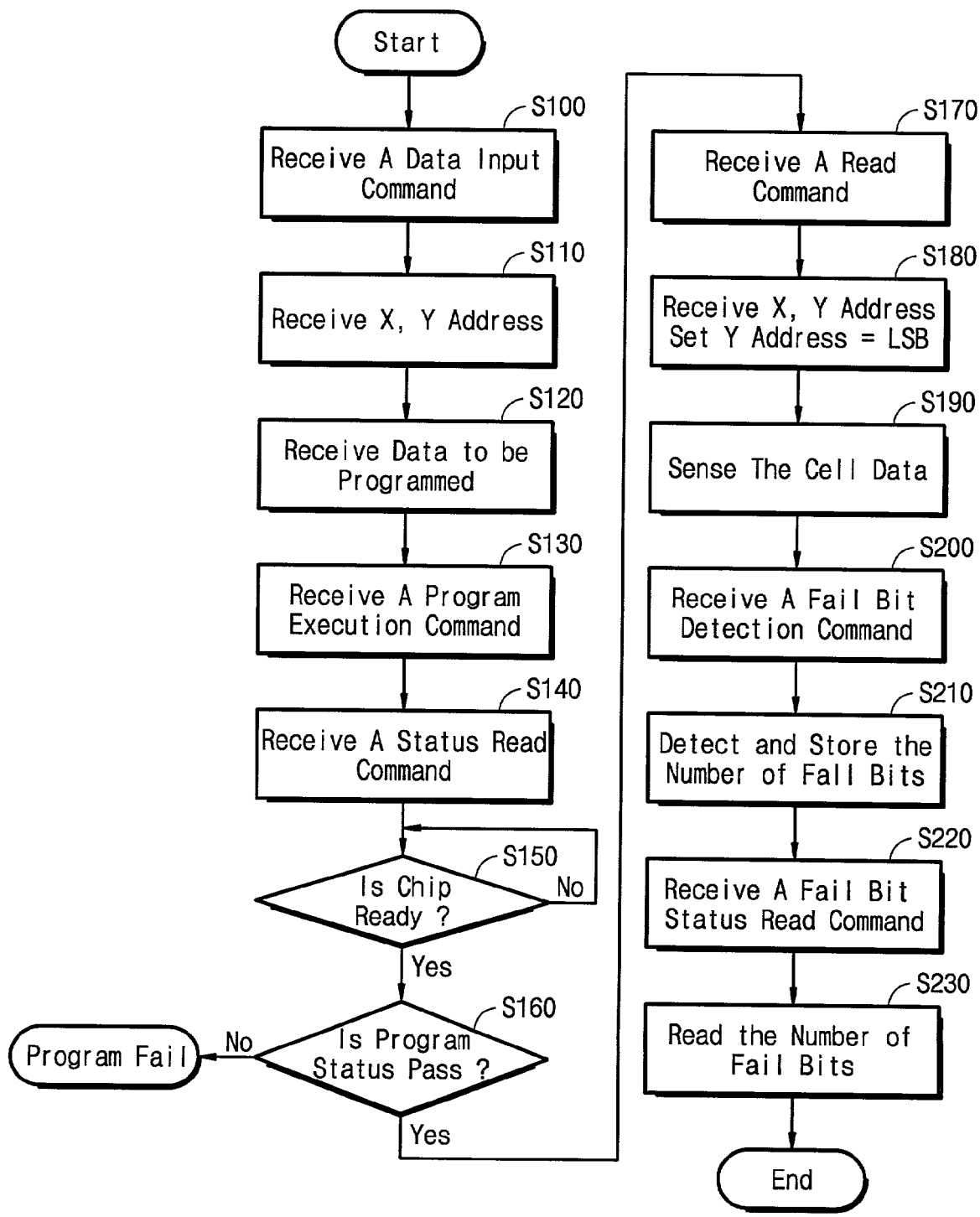
FIG. 9 is a flow chart illustrating an overall operation of the nonvolatile semiconductor memory device according to the present invention.

Referring now to FIG. 9, a flow chart illustrates the overall operation of the nonvolatile semiconductor memory device 1 of FIG. 1. After a data input command is inputted in step S100, a row address and then a column address to be tested are sequentially inputted in step S110. And then a data to be programmed is sequentially inputted via input/output pins IO[i] in step S120. After the preparation for executing a program is completed, a programming operation is performed according to the input of a program executing command in step S130. If a status reading command is inputted in step S140, it is determined whether the chip is ready or busy, in step S150. If the chip is ready, it is determined whether the programming operation has been normally performed in step S160. If the chip is not ready, the programming operation is ended as a fail. If the programming operation has been normally performed, the programming operation will be ended as a pass.

The above described portion of the programming method is also disclosed in U.S. Pat. No. 5,473,563, U.S. Pat. No. 5,541,879, U.S. Pat. No. 5,546,341, and U.S. Pat. No. 5,712,818, which are hereby incorporated in this document by reference.

If the programming operation is determined as a pass in step S160, a read-out command is inputted in step S170 and a row address and a column address are inputted in step S180. Then a value of the column address is set to a minimum (LSB). Then, cell data stored in memory cells of a row or a page corresponding to the set row address are sensed by the page buffer and latch block 160 in step S190. In next step S200 the fail bit detecting command is inputted and the number of fail bits is detected and stored via a series of fail bit detecting procedure in step S210. The fail bit condition read-out command is inputted in step S220, a fail code is outputted representing the number of fail bits in step S230. The fail bit detecting steps S200 to S230 described above will be discussed more in detail hereinafter.

Figure 10:
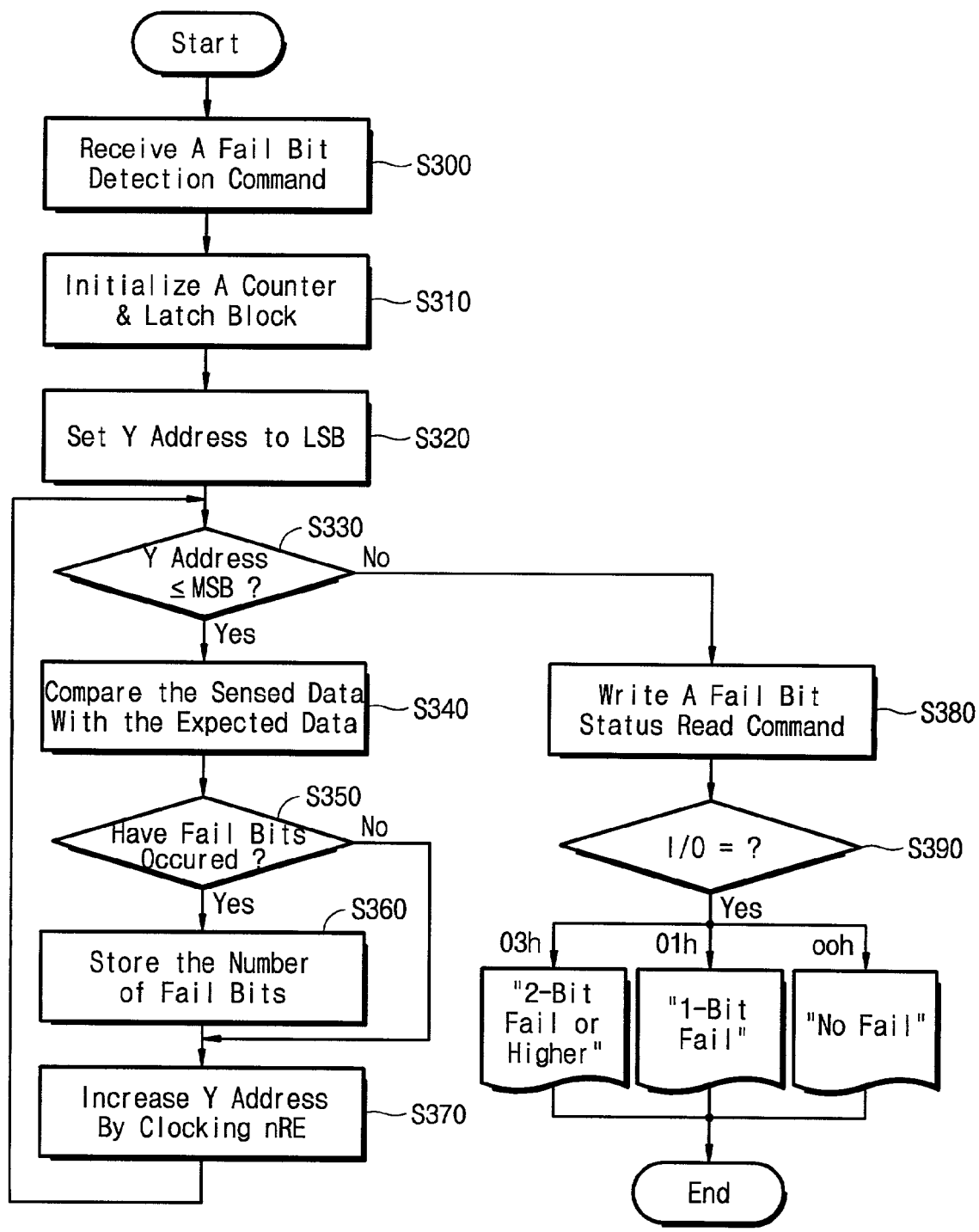
FIG. 10 is a flow chart explaining the fail bit detecting operation according to the present invention.
Figure 11A:
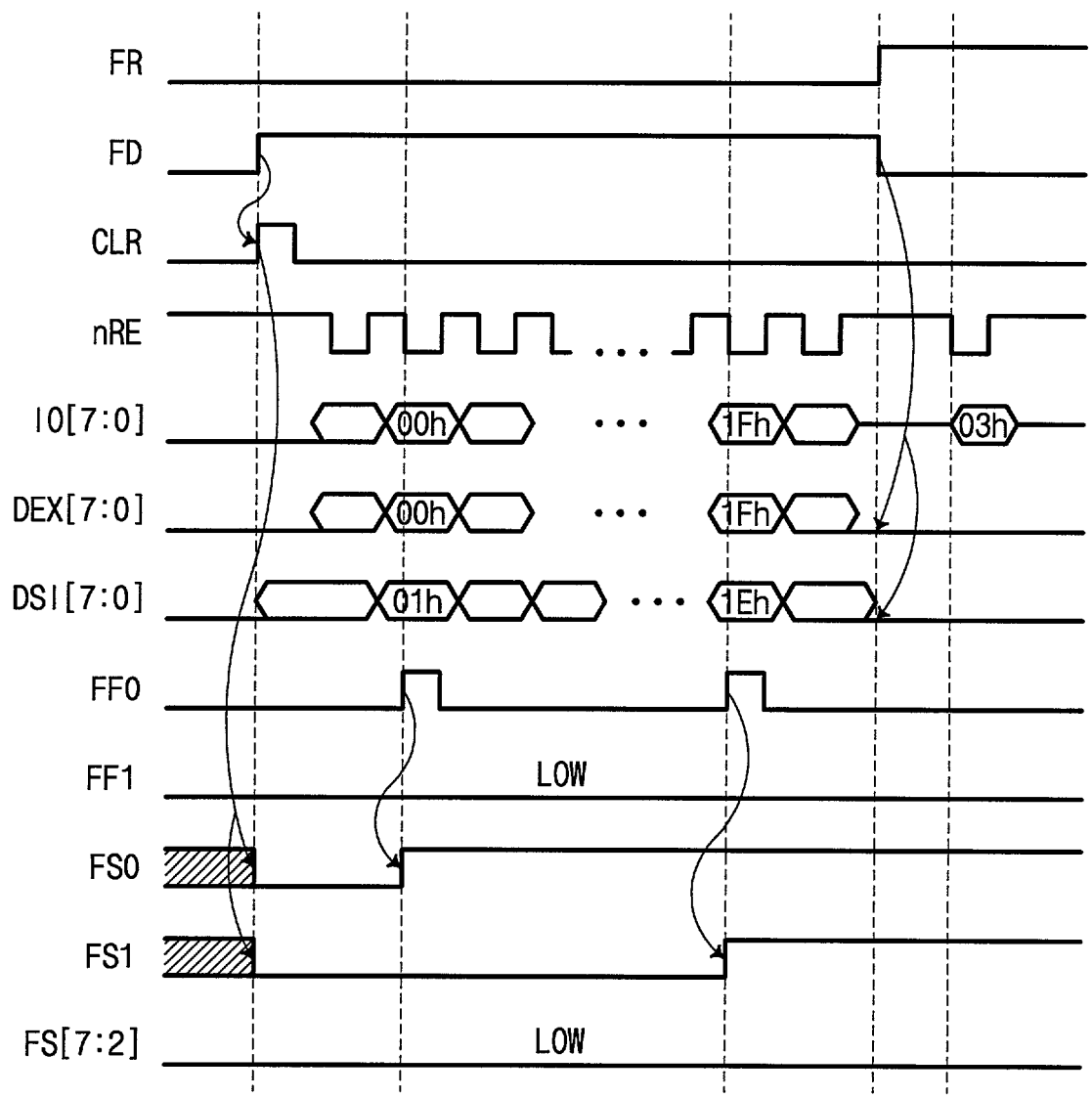
FIGS. 11A and 11B are timing diagrams of the operation of the nonvolatile semiconductor memory device in which 2 or more fail bits are generated.
Figure 11B:
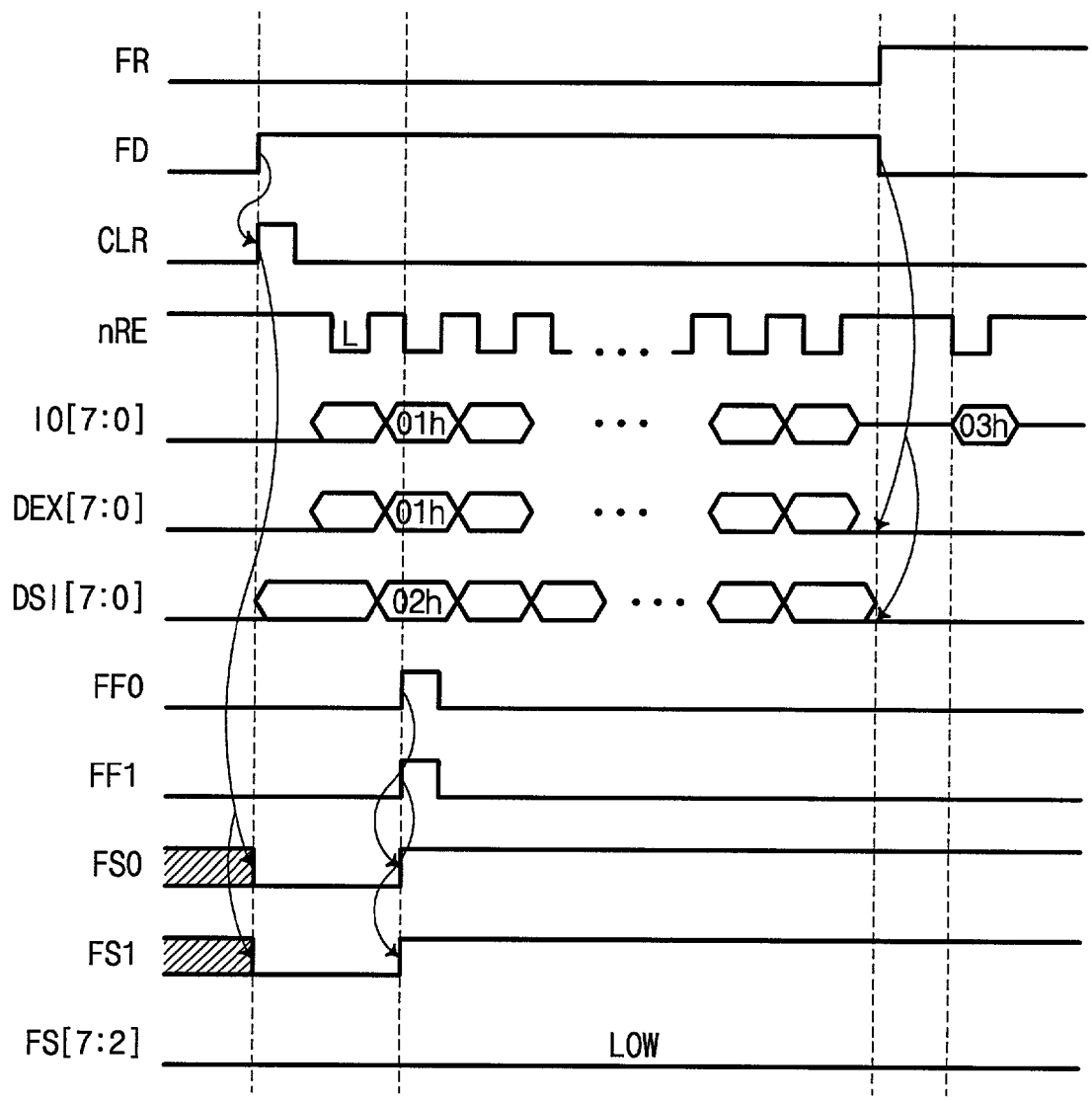

The flow chart illustrating the operation of detecting fail bits according to the invention is shown in FIG. 10. FIGS. 11A and 11B are diagrams of an operational timing of a nonvolatile semiconductor memory device in which 2 or more fail bits are generated. Fail bit detecting operation will be discussed with reference to appended drawings as follows.

For convenient description, it is assumed that a programming operation is being performed and a read command is being inputted over a page. That is to say, the fail bit detecting operation over one page will be described next. However, it is apparent to a person skilled in the art that the number of fail bits contained in a memory block including a plurality of pages can be detected by a fail bit detecting scheme according to the invention.

As is shown in FIG. 10, the fail bit detecting command is sent to the command register block 120 via the global buffer and control buffer block 110. The command register block 120 activates a fail bit detecting command signal FD in response to a fail bit detecting command. According to activation of the fail bit detecting command signal FD, the pulse generator 560 of the fail bit counter and latch block 210 generates a pulse signal CLR (see FIG. 4). Consequently, T flip-flops 561 and 562 and S-R flip-flops 565 and 566 of the fail bit counter and latch block 210 are initialized. These initialized operations are performed in step S310. Then, the fail status signals FS[0]–FS[7] are maintained at a low level, as is shown in FIGS. 11A and 11B.

After the column address is set to a minimum LSB in next step S320, it is determined whether the column address is a maximum MSB in step S330. The column select block 170 selects data bits corresponding to the column address set to the LSB among data bits sensed by a reading operation and sends the selected read-out data bits to the fail bit detecting block 200 via the data input/output control block 180 in synchronization with the read enable signal nREO. Furthermore, the expected data buffer block 190 sends to the fail bit detecting block 200 the expected data bits DEX[i] which are supplied to the input/output pins IO[i] during an activation period of the fail bit detecting command signal FD.

The fail bit detecting block 200 compares the inputted read-out data bits DSI[i] with the expected data bits DEX[i] and generates the fail flag signals FF[0] and FF[1] according to the comparison result. It is determined whether the fail bits are generated in the next step S350. For example, if one of the read data bits is a fail bit as is shown in FIG. 11A, the fail flag signal FF[0] is activated during a low period of the read-out enable signal nREO thereby causing the fail status signal FS[0] to be activated to a high level as is described above. That is to say, the number, 1, meaning that 1 bit fail is generated is stored in a S-R flip-flop 565 of the fail bit counter and latch block 210 in step S360. Then, the process proceeds to step S370 in which the column address is incremented in synchronization with the signal nRE. If the read-out data bits match all the expected data bits, the process proceeds to step S370.

The loop of the steps S330 to S370 is repeatedly performed until the column address reaches a maximum. When the loop of the steps S330 to S370 is performed, one of the read-out data bits may be determined as a fail bit back, as is shown in FIG. 11A. In this case, the fail flag signal FF[1] is activated during a low period of the read-out enable signal nREO to thereby causing the fail status signal FS[1] to be activated to a high level as is discussed above. That is to say, the number, 2, meaning that 2-bit fails are generated is stored in S-R flip-flops 565 and 566 of the fail bit counter and latch block 210.

Also as is shown in FIG. 11B, 2 data bits of the read-out data bits can be determined as fail bits simultaneously. In this case, the fail flag signals FF[0] and FF[1] are activated simultaneously during a low period of the read-out enable signal nREO to thereby causing the fail status signals FS[0] and FS[1] to be activated to a high level simultaneously. That is to say, the number, 2, meaning that 2-bit fails are generated is stored in S-R flip-flops 565 and 566 of the fail bit counter and latch block 210.

Sequentially, if it is determined that the column address is a maximum MSB in step S330, the fail bit status read-out command will be inputted in step S380. According to this a command register block 120 causes the fail bit detecting command signal FD to be at a low level and the fail bit read command signal FR to be at a high level. The data output buffer block 220 outputs the fail status signal FS[0] to FS[7] outputted from the fail bit counter and latch block 210 via the input/output pins IO[0] to IO[7] in response to the fail bit read command signal FR in the high level.

As is described above, since the fail status signals FS[2] to FS[7] are maintained at a low level, the number of fail bits over one page will be determined according to logic statuses of the input/output pins IO[0] and IO[1]. As is known in FIGS. 11A and 11B, since both the fail status signals FS[0] and FS[1] become at high level, the logic statuses of corresponding input/output pins IO[0] and IO[1] will be "11" ("03h" as a fail code). That is, the fact that 2-bit fails are generated will be detected from the outside.

Figure 12:
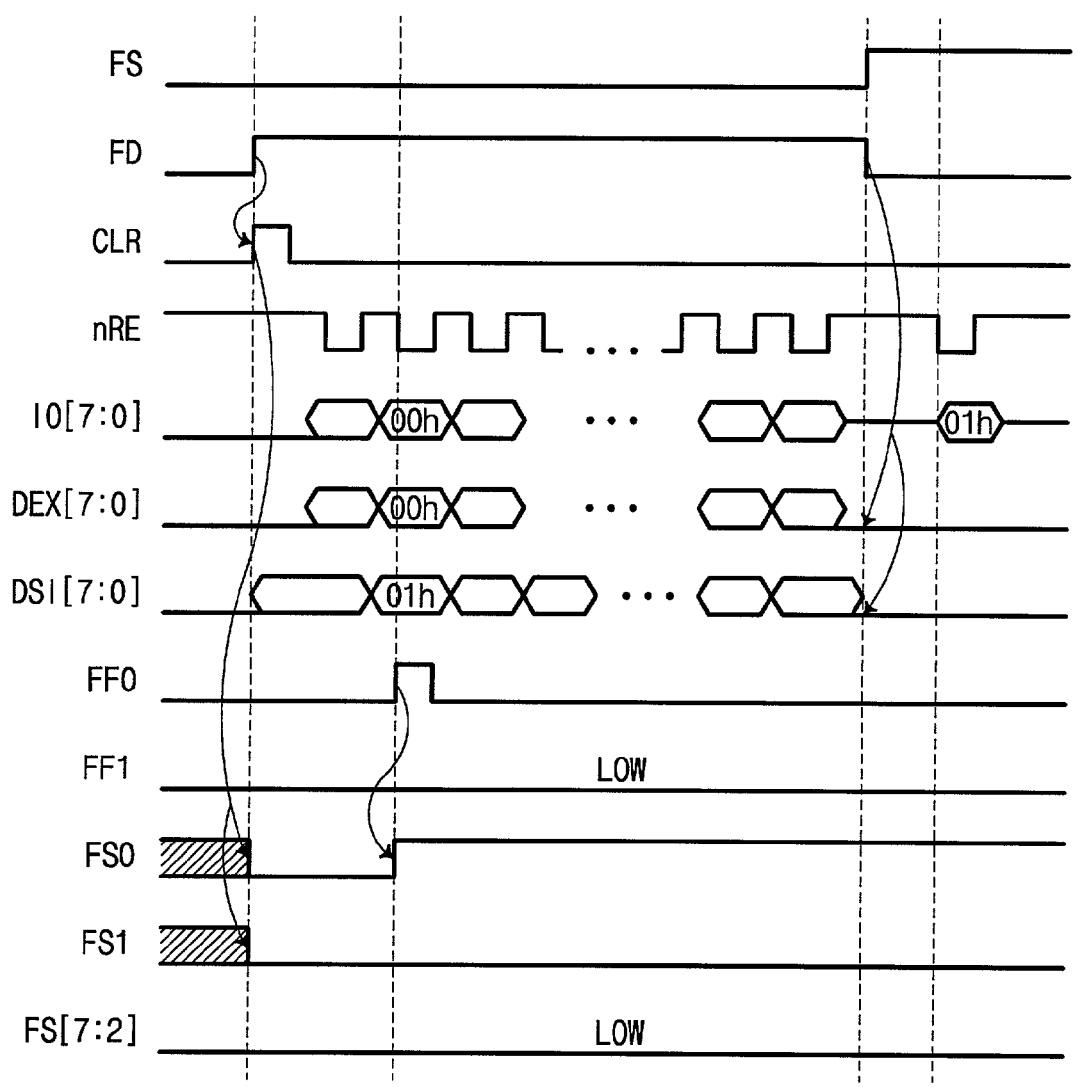
FIG. 12 is a timing diagram of the operation of the nonvolatile semiconductor memory device in which one fail bit is generated.

Referring to FIG. 12 illustrating a diagram of the operational timing of the nonvolatile semiconductor memory device in which one fail bit is generated, then as is discussed above, in case only one fail bit is generated, the fail status signal FS[0] is maintained at a high level and the fail status signal FS[1] is maintained at a low level. Since the fail status signals FS[1] and FS[0] are in a high level and a low level respectively, the logic statuses of the corresponding input/ output pins IO[1] and IO[0] will be "01" ("01h" as a fail code). That is, the fact that 1-bit fail is generated will be detected from the outside.

Figure 13:
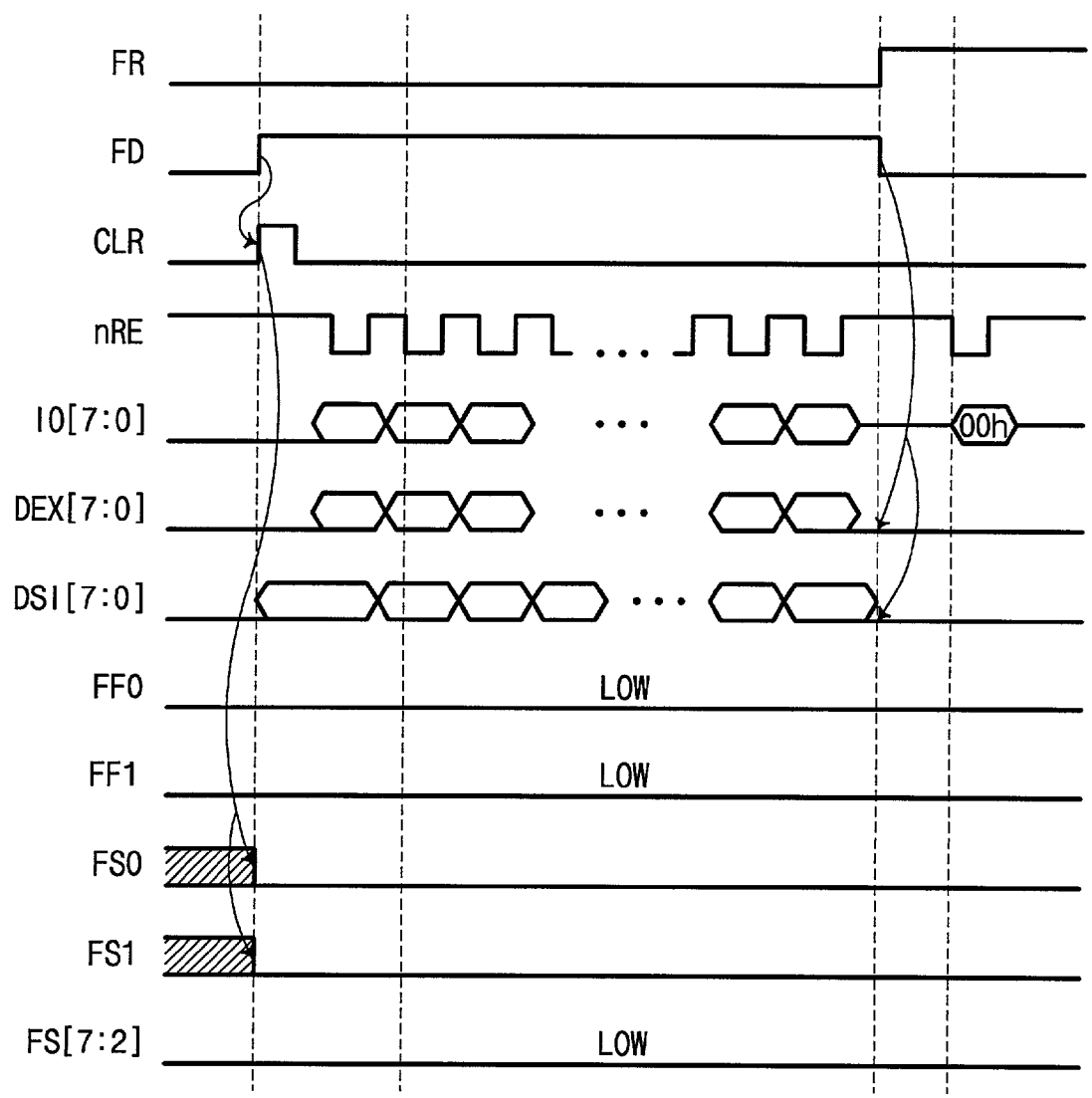
FIG. 13 is a timing diagram of the operation of the nonvolatile semiconductor memory device in which no fail bit is generated.

Referring to FIG. 13 illustrating a diagram of the operational timing of the nonvolatile semiconductor memory device in which no fail bit is generated, then as is discussed above, in case no fail bit is generated, both the fail status signals FS[0] and FS[1] are maintained at a low level. Since both the fail status signals FS[1] and FS[0] are a low level, the logic statuses of the corresponding input/output pins IO[1] and IO[0] will be "00" ("00h" as a fail code). That is, the fact that no bit fail is generated will be detected from the outside.

According to this fail bit detecting scheme, the number of fail bits of each memory block can be detected. For example, an arbitrary memory block of the memory device after packaged may be determined as a bad block by a progressive fail. Then, if the number of fail bits in the memory block will be in the range of the number of fail bits over which the fail bits can be corrected by an error correction code algorithm of the electronic system, such a memory device can be used as it is without disposal, thereby enhancing the yield of the product.

Figure 14:
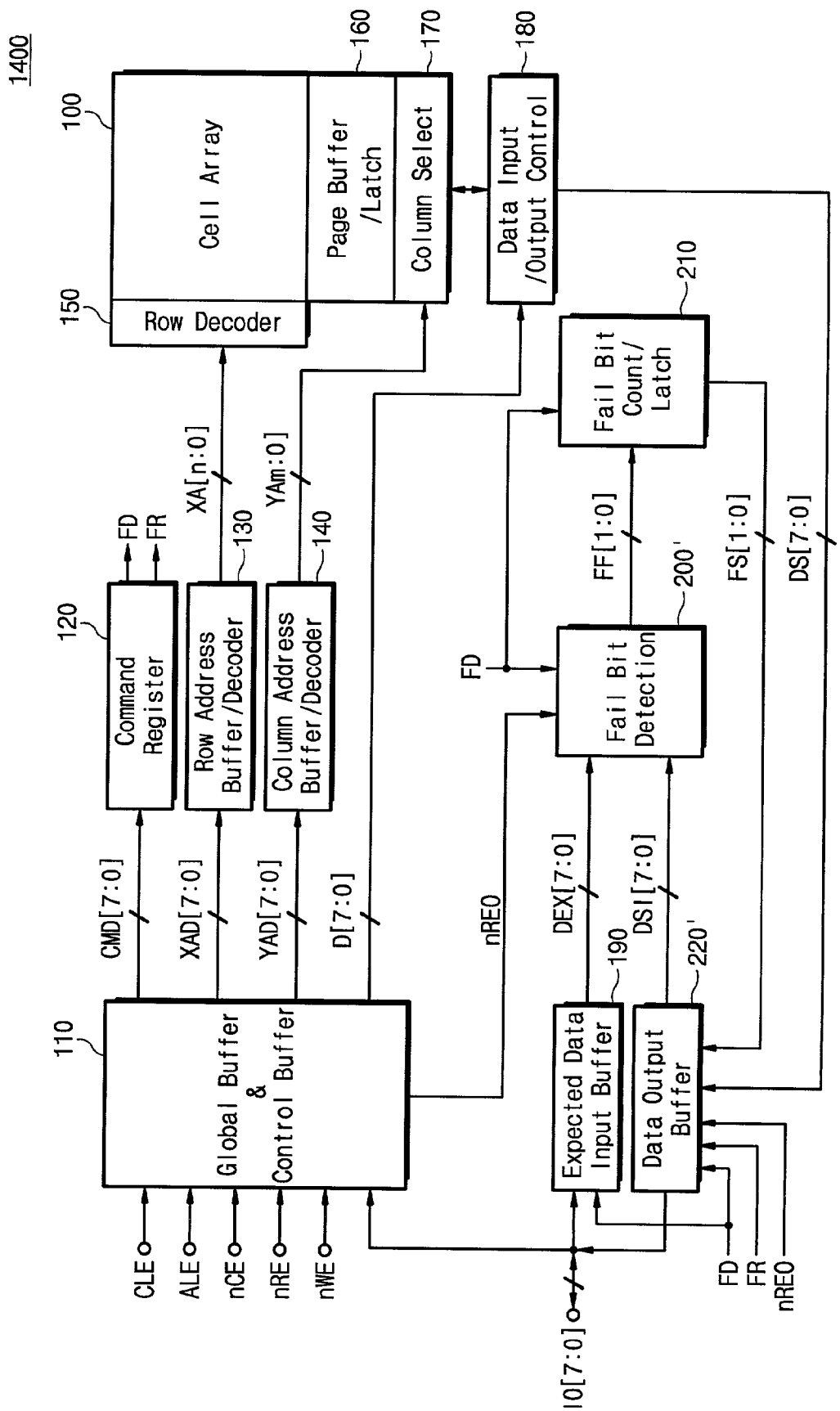
FIG. 14 is a block diagram of a nonvolatile semiconductor memory device according to a second embodiment of the present invention.

FIG. 14 is a block diagram illustrating a nonvolatile semiconductor memory device 1400 according to the second embodiment of the present invention. The second embodiment of the present invention is identical with the first embodiment of FIG. 1 in many aspects, whose identical description is therefore not repeated as superfluous.

A key difference of the second embodiment from the first embodiment is that the sensed data bits DS[i] are sent to a fail bit detecting block 200' via a data output buffer block 220'. In other words, detecting (and also optionally counting) are performed after the data output buffer block 220', not before it. This entails that detection, and also optionally counting, are outside the path between cell array 100 and data output buffer 220'.

Figure 15:
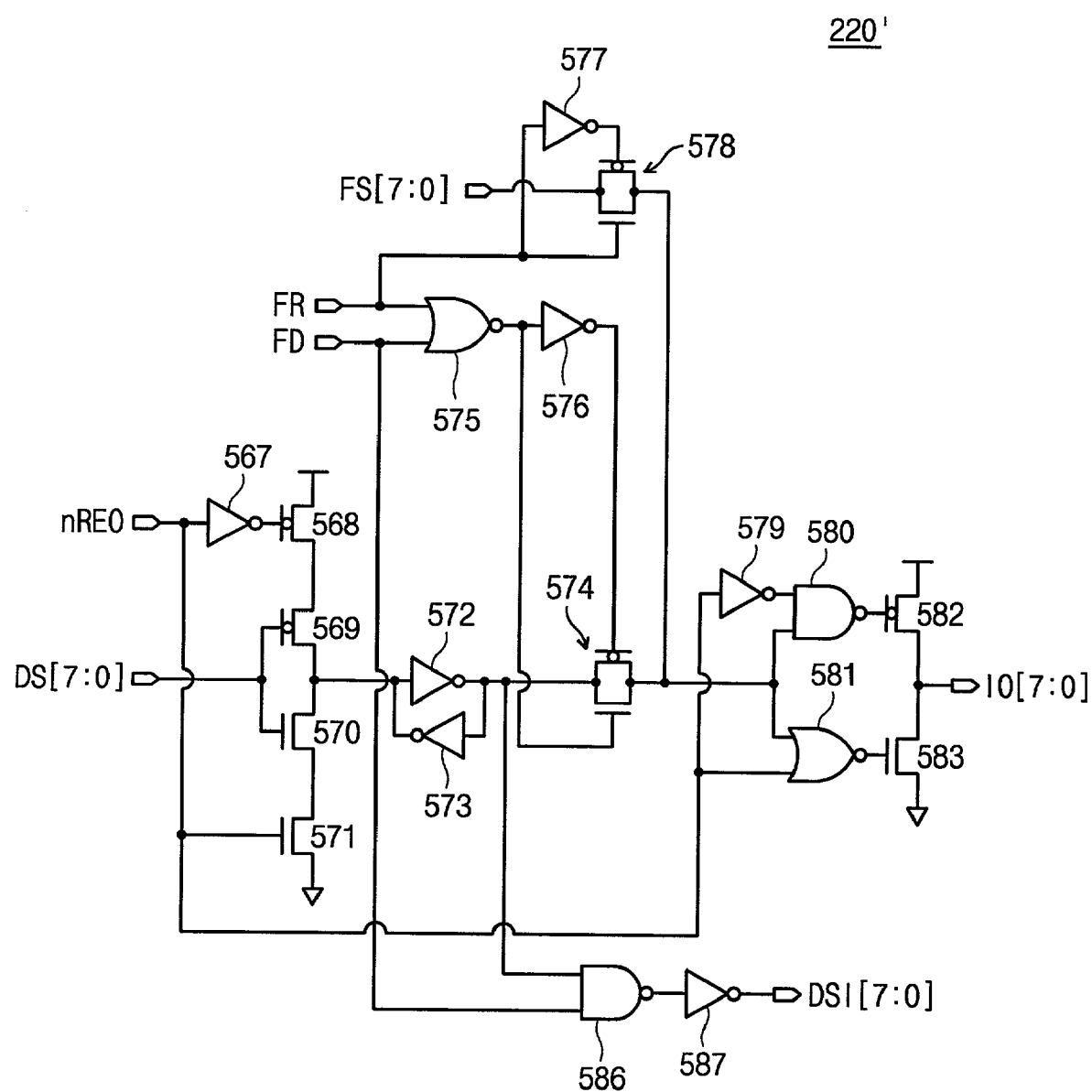
FIG. 15 shows a preferred embodiment of a data output buffer block shown in FIG. 14.

Referring to FIG. 15 illustrating a data output buffer block 220' according to the second embodiment of the present invention, a data transfer path (including a NAND gate 586 and an inverter 587) for outputting the data bits DS[i] outputted from the data input/output control block 180' as read-out data bits DSI[i] is added to the data output buffer block 220' according to the second embodiment.

Figure 16:
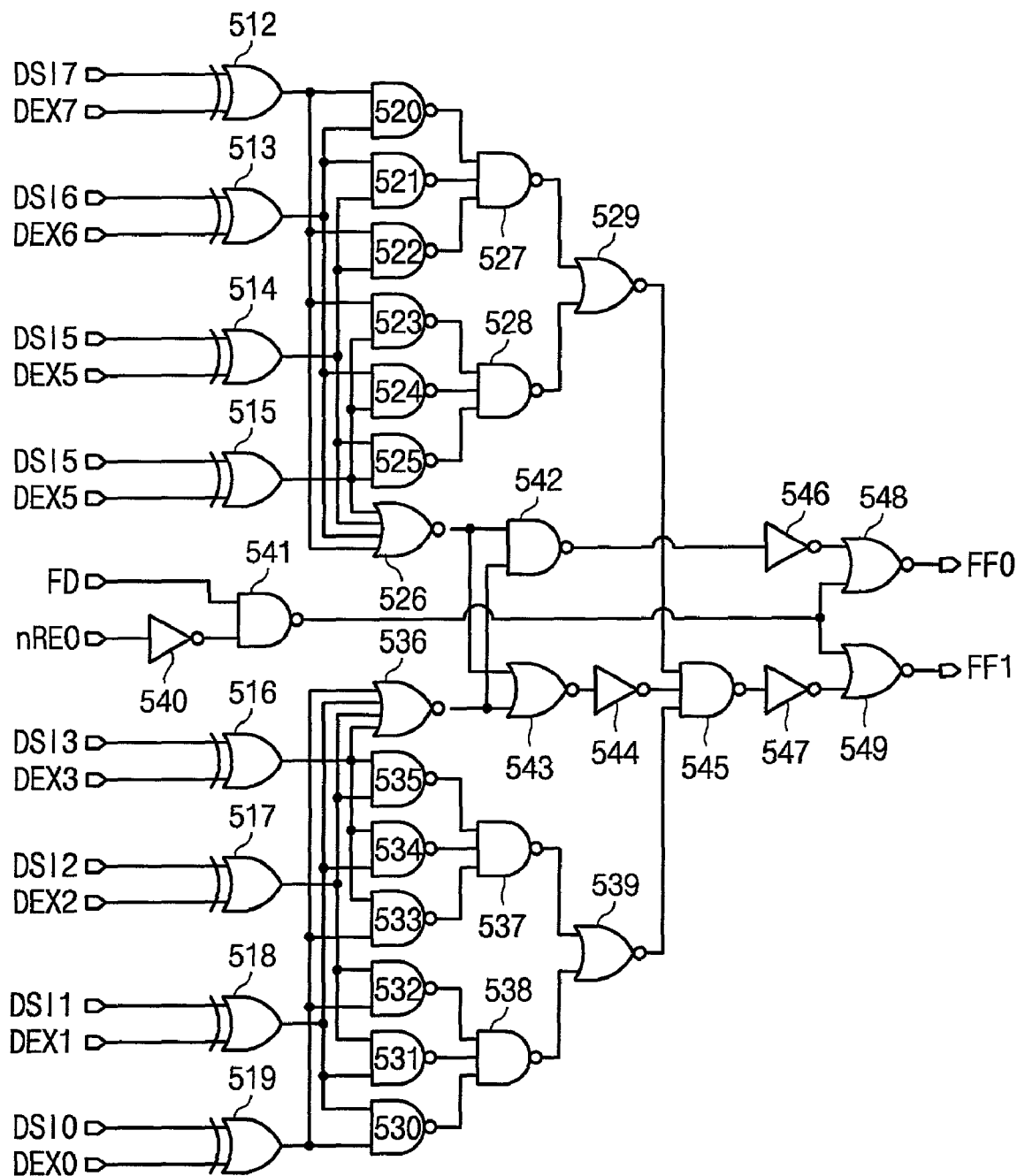
FIG. 16 shows a preferred embodiment of a fail bit detecting block shown in FIG. 14.

Referring to FIG. 16, a fail bit detecting block 200' according to the second embodiment of the invention is shown. It will be recognized that block 200' is similar to the fail flag signal generating part 200b of the fail bit detecting block 200 shown in FIG. 3. Its further description is therefore not repeated, as superfluous.

Referring back to FIG. 14, the fail bit detecting operation of the nonvolatile semiconductor memory device 1400 is identical with that of first embodiment described with reference to flow charts in FIGS. 11A and 11B, FIG. 12 and FIG. 13 and the description thereof will also be omitted. Therefore it will be apparent to a person skilled in the art that the second embodiment has same effects as first embodiment.

As will be described above, the memory device according to the present invention gives enhanced yield of the memory device by exactly counting the number of fail bits generated in the process of programming/reading data in/from a nonvolatile semiconductor memory device. Furthermore, the memory device gives reduced test time over that of a conventional device operated in software.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A memory device, comprising:
a plurality of memory cells to store data;
a data output buffer adapted to operate in a first mode and a second mode, wherein the first mode operates to output data stored in the memory cells;
a comparator to determine failure of the memory cells to store the data, by comparing the stored data with expected data; and
a fail bit counter for counting the number of those of the memory cells that fail to store data, and for outputting a fail code representing the counted number of the fail bits to the data output buffer, wherein the second mode of the data output buffer operates to output the fail code.

2. The device of claim 1, further comprising:
a fail bit detecting circuit for detecting those of the memory cells that fail to store data, and for updating the fail bit counter accordingly.

3. The device of claim 2, in which
the fail bit detecting circuit includes a latch for storing signals that encode the counted number of failed bits.

4. The device of claim 2, in which
the fail bit detecting circuit is in a data output path between the memory cells and the data output buffer.

5. The device of claim 2, further comprising:
an expected data input buffer circuit for receiving externally supplied expected data bits,
in which the comparator is adapted to compare the externally supplied expected data bits with test bits stored in the memory cells to detect those of the memory cells that fail to store data.

6. The device of claim 5, in which
during a test operation, data bits identical to the externally supplied expected data bits have been stored in the memory cells.

7. The device of claim 1, wherein the data stored in the memory cells is blocked from being output while operating in the second mode.

8. The device of claim 1, wherein the data output buffer includes a first circuit path for data stored in the memory cells and a second circuit path for the fail code, wherein only the first or the second circuit path is operational, responsive to a test command.

9. A nonvolatile semiconductor memory device, comprising:
an array of memory cells arranged in the form of a matrix having rows and columns;
a row decoder circuit for selecting one of the rows in accordance with a row address;
a column select circuit for selecting some of the columns in response to a column address and outputting data bits corresponding the selected columns;
an expected data input buffer circuit for receiving expected data bits supplied from the outside via input/output pins in response to a fail bit detecting command signal;
a fail bit detecting circuit for operating in response to the fail bit detecting command signal, receiving the expected data bits and the selected data bits, determining failure of the memory cells to store the data, by comparing the selected data bits with the expected data bits, and determining whether the data bits selected by the column select circuit include fail bits, and outputting fail flag signals according to the determination result;
a fail bit counter and latch circuit for counting the number of the fail bits of the data bits stored in the selected row memory cells in response to the fail flag signals from the fail bit detecting circuit and outputting a fail code representing the counted number of the fail bits; and
a data output buffer adapted to operate in a first mode and a second mode, wherein the first mode operates to output data stored in the memory cells and the second mode operates to output the fail code.

10. The device of claim 9, in which
the fail bit detecting circuit receives data bits sent via the column select circuit in synchronization with read-out enable signals.

11. The device of claim 9, in which
the fail bit counter and latch circuit is initialized when the fail bit detecting command signal is transitioned from a low level to a high level.

12. The device of claim 9, further comprising:
a data output buffer circuit connected to the input/output pins, and
in which the data output buffer circuit prevents the data bits selected by the column select circuit from being sent to the input/output pins during an activation period of the fail bit detecting command signal.

13. The device of claim 12, in which
the data output buffer circuit allows a fail code from the fail bit counter and latch circuit to be sent to the input/output pins in synchronization with clock signals during the activation period of the fail bit read-out command signal.

14. The device according to claim 9, further comprising:
a data output buffer circuit connected to the input/output pins, and
in which the data output buffer circuit allows the data bits selected by the column select circuit to be sent to the fail bit detecting circuit and prevents the data bits selected by the column select circuit from being sent to the input/output pins during an activation period of the fail bit detecting command signal.

15. The device of claim 14, in which
the data input/output buffer circuit allows a fail code from the fail bit counter and latch circuit to be sent to the input/output pins in synchronization with the clock signal during the activation period of the fail bit read-out command signal.

16. The device of claim 9, in which
the fail bit detecting circuit generates first and second fail flag signals.

17. The device of claim 16, in which the fail bit detecting circuit
activates the first fail flag signal when one of the inputted data bits is a fail bit, and
activates the first and second fail flag signals simultaneously when at least 2 bits of the inputted data bits are fail bits.

18. The device of claim 16, in which
each of the first and second fail flag signals is activated as a clock signal during the activation period of the read-out enable signal.

19. The device of claim 16, in which the fail bit counter and latch circuit includes:
a counter for outputting first and second count signal in response to the first fail flag signal, in which the first count signal is activated in pulse corresponding to the first activation of the first fail flag signal and the second count signal is activated in pulse corresponding to the second activation of the second fail flag signal;

a combination circuit for outputting a set signal by combination of the second count signal and the second fail flag signal; and a register for activating first fail status signal when the first count signal is activated and second fail status signal when the set signal from the combination circuit is activated.

20. The device of claim 19, in which the fail bit counter and latch circuit further includes:

a pulse generator for generating a pulse signal, when the fail bit detecting command signal is activated and the counter and the register are initialized by the pulse signal.

21. A method for detecting fail bits in a nonvolatile semiconductor memory device, comprising:

storing test data in memory cells of the device;

inputting expected data in an expected data buffer of the device;

comparing the stored expected data with the stored test data to determine failure of the memory cells to store data;

creating a fall code to registering failure occasions in which the inputted expected data does not correspond with the stored test data;

outputting data stored in the memory cells from a data output buffer; and outputting the fail code from the data output buffer.

22. The method of claim 21, in which
the test data is identical to the expected data.

23. The method of claim 21, further comprising:
receiving a fail bit detecting command signal to initiate the comparing.

24. The method of claim 21, further comprising:
counting the registered failure occasions in a counter of the device.

25. The method of claim 24, further comprising:
outputting to an output data buffer of the device signals encoding a number of the counted failure occasions.

26. The method of claim 24, further comprising:
initializing the counter.

27. A method for detecting fail bits in a nonvolatile semiconductor memory device having an array of memory cells, comprising:

detecting data stored in the array in response to a read command signal;

selecting some of the detected data bits in response to a column address;

determining whether the selected data bits each matches corresponding expected data bits applied from the outside;

counting the number of data bits unmatched in the determining step;

storing a fail code determined according to the counted number, incrementing the column address;

performing repeatedly the selecting, determining, counting and storing steps until a maximum of the column address is reached;

outputting data stored in the memory cells from a data output buffer; and outputting the fail code from the data output buffer.

28. The method of claim 27, further comprising:
receiving a fail bit detecting command signal to initiate the determining.

29. The method of claim 27, further comprising:
outputting the stored fail code in response to a fail bit read-out command signal, until a maximum of the column address is reached.

30. The method of claim 27, further comprising:
initializing a fail bit counter and latch circuit in response to the fail bit detecting signal when the fail bit detecting signal is activated after the detecting step has been completed, and the fail code is stored in the fail bit counter and latch circuit.

31. A nonvolatile semiconductor memory device, comprising:

an array of memory cells arranged in the form of a matrix having rows and columns;

a row decoder circuit for selecting one of the rows in accordance with a row address;

a column select circuit for selecting some of the columns in response to a column address and outputting data bits corresponding the selected columns;

an expected data input buffer circuit for receiving expected data bits supplied from the outside via input/output pins in response to a fail bit detecting command signal;

a fail bit detecting circuit for operating in response to the fail bit detecting command signal, receiving the expected data bits and the selected data bits, determining failure of the memory cells to store the data, by comparing the selected data bits with the expected data bits, and determining whether the data bits selected by the column select circuit include fail bits, and outputting fail flag signals according to the determination result, the fail bit detecting circuit generating first and second fail flag signals; and a fail bit counter and latch circuit for counting the number of the fail bits of the data bits stored in the selected row memory cells in response to the fail flag signals from the fail bit detecting circuit and outputting a fail code representing the counted number of the fail bits, the fail bit counter and latch circuit including:

a counter for outputting first and second count signal in response to the first fail flag signal, in which the first count signal is activated in pulse corresponding to the first activation of the first fail flag signal and the second count signal is activated in pulse corresponding to the second activation of the second fail flag signal;

a combination circuit for outputting a set signal by combination of the second count signal and the second fail flag signal; and a register for activating first fail status signal when the first count signal is activated and second fail status signal when the set signal from the combination circuit is activated.

32. The device of claim 31, in which the fail bit counter and latch circuit further includes:

a pulse generator for generating a pulse signal, when the fail bit detecting command signal is activated and the counter and the register are initialized by the pulse signal.

* * * * *

UNITED STATES PATENT AND TRADEMARK OFFICE
CERTIFICATE OF CORRECTION

| | | |
|---|---|---|
| PATENT NO. | : 7,024,598 B2 | Page 1 of 1 |
| APPLICATION NO. | : 10/003390 | |
| DATED | : April 4, 2006 | |
| INVENTOR(S) | : Jeong et al. | |

It is certified that error appears in the above-identified patent and that said Letters Patent is hereby corrected as shown below:

At column 13, line 25, please replace "to registering" with --to register--

Signed and Sealed this

Fifteenth Day of April, 2008

JON W. DUDAS
*Director of the United States Patent and Trademark Office*